(12) United States Patent
Kokubun et al.

(10) Patent No.: US 8,461,659 B2
(45) Date of Patent: Jun. 11, 2013

(54) SOLID STATE IMAGING APPARATUS

(75) Inventors: Koichi Kokubun, Kanagawa (JP); Kazufumi Shiozawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 13/052,301

(22) Filed: Mar. 21, 2011

(65) Prior Publication Data

US 2012/0001285 A1 Jan. 5, 2012

(30) Foreign Application Priority Data

Jun. 30, 2010 (JP) ................................. 2010-150106

(51) Int. Cl.
*H01L 31/0232* (2006.01)
*H01L 21/00* (2006.01)

(52) U.S. Cl.
USPC ...... 257/432; 257/98; 257/294; 257/E31.123; 438/70; 348/273

(58) Field of Classification Search
USPC  438/70; 257/98, 294, 432, E31.123; 348/273
See application file for complete search history.

(56) References Cited

U.S. PATENT DOCUMENTS

| 4,656,109 A * | 4/1987 | Ueno ............................ 430/46.2 |
| 6,268,558 B1 * | 7/2001 | Kubota ........................... 136/244 |
| 7,623,166 B2 * | 11/2009 | Inaba et al. .................... 348/273 |
| 7,701,024 B2 * | 4/2010 | Kasano et al. ................. 257/432 |
| 8,035,710 B2 * | 10/2011 | Koyama ......................... 348/273 |
| 8,227,883 B2 * | 7/2012 | Kasano et al. ................. 257/432 |
| 2006/0285005 A1 * | 12/2006 | Inaba et al. .................... 348/340 |
| 2007/0285539 A1 * | 12/2007 | Shimizu et al. ............... 348/272 |
| 2009/0273046 A1 | 11/2009 | Inaba et al. |
| 2009/0321865 A1 * | 12/2009 | Kasano et al. ................. 257/432 |

FOREIGN PATENT DOCUMENTS

| JP | 2000-329933 | 11/2000 |
| JP | 2005-017956 | 1/2005 |
| JP | 2007-019143 | 1/2007 |
| JP | 2007-317750 | 12/2007 |
| JP | 2008-021866 | 1/2008 |
| JP | 2008-299248 | 12/2008 |

OTHER PUBLICATIONS

K. Kokubun, et al. Asymmetric Structure of Photonic Crystal Color Filter for CMOS Image Sensor. 23rd International Microprocesses and Conference 2010.

* cited by examiner

*Primary Examiner* — Jarrett Stark
*Assistant Examiner* — Nicholas Tobergte
(74) *Attorney, Agent, or Firm* — Turocy & Watson, LLP (57) ABSTRACT

According to one embodiment, in the upper laminated structure, first layers and second layers are alternately laminated, the first layer and the second layer having different refractive indices. In the lower laminated structure, first layers and second layers are alternately laminated, the first layer and the second layer having different refractive indices. The upper laminated structure and the lower laminated structure are equal in number of layers laminated therein. Each of the lowermost layer of the upper laminated structure and the uppermost layer of the lower laminated structure are configured by the first layer. The upper laminated structure and the lower laminated structure are configured to be asymmetric to each other such that, within some layer sets out of a plurality of layer sets each including two layers disposed at corresponding positions in the upper and lower laminated layers, one layer of the two layers in each layer set of the some layer sets is thinner than the other layer.

18 Claims, 8 Drawing Sheets

SOLID STATE IMAGING APPARATUS

CROSS-REFERENCE TO RELATED APPLICATIONS

This application is based upon and claims the benefit of priority from the prior Japanese Patent Application No. 2010-150106, filed on Jun. 30, 2010; the entire contents of which are incorporated herein by reference.

FIELD

Embodiments described herein relate generally to a solid state imaging apparatus.

BACKGROUND

Currently, it is general that color filters used in image sensors are configured with use of an organic dye. Taking technology trends into consideration such as shrinkage of pixels (that is, the increase in number of pixels) which might progress further in the future, and lower profile represented by a back side illumination type, it is anticipated that processing of an organic dye filter tomes to a stalemate in coping with shrinkage and thin filming (contributing to low profile). To solve such a problem, suggested is an interference filter type of a color filer that is made of an inorganic material and uses the one-dimensional photonic crystal (the structure in which high refractive index materials and low refractive index materials are periodically laminated).

In the color filter of an interference filter type, the wavelength at the center portion of the visible light region is set as a central wavelength. In a case where this color filter is configured to have the peak of spectral transmittance on the shorter wavelength side than the central wavelength, the peak of the first order cannot be used as a spectral transmittance peak. That is, only the peak of the higher order than the first order is allowed to be used, and thus there is a trend that the spectrum width is narrow. Accordingly, in such an image sensor (solid state imaging apparatus), a photoelectric conversion layer corresponding to a color filter (a multilayer interference filter) for a color of a wavelength shorter than the central wavelength cannot receive a sufficient amount of light that is required to obtain a given sensitivity and this is likely to result in a weak sensitivity.

BRIEF DESCRIPTION OF THE DRAWINGS

FIGS. 3A to 4B are diagrams illustrating a method of manufacturing a solid state imaging apparatus according to an exemplary embodiment;

DETAILED DESCRIPTION

In general, according to one embodiment, there is provided a solid state imaging apparatus including a photoelectric conversion layer and a multilayer interference filter. The multilayer interference filter is disposed so as to selectively guide light of a predetermined color, out of incident light, to the photoelectric conversion layer. The multilayer interference filter includes an upper laminated structure and a lower laminated structure. In the upper laminated structure, first layers and second layers are alternately laminated, the first layer and the second layer having different refractive indices. In the lower laminated structure, first layers and second layers are alternately laminated, the first layer and the second layer having different refractive indices. The upper laminated structure and the lower laminated structure are equal in number of layers laminated therein. Each of the lowermost layer of the upper laminated structure and the uppermost layer of the lower laminated structure are configured by the first layer. The upper laminated structure and the lower laminated structure are configured to be asymmetric to each other such that, within some layer sets out of a plurality of layer sets each including two layers disposed at corresponding positions in the upper and lower laminated layers, one layer of the two layers in each layer set of the some layer sets is thinner than the other layer.

An exemplary embodiment of a solid state imaging apparatus will be explained below in detail with reference to the accompanying drawings.

Exemplary Embodiment

Figure 1:
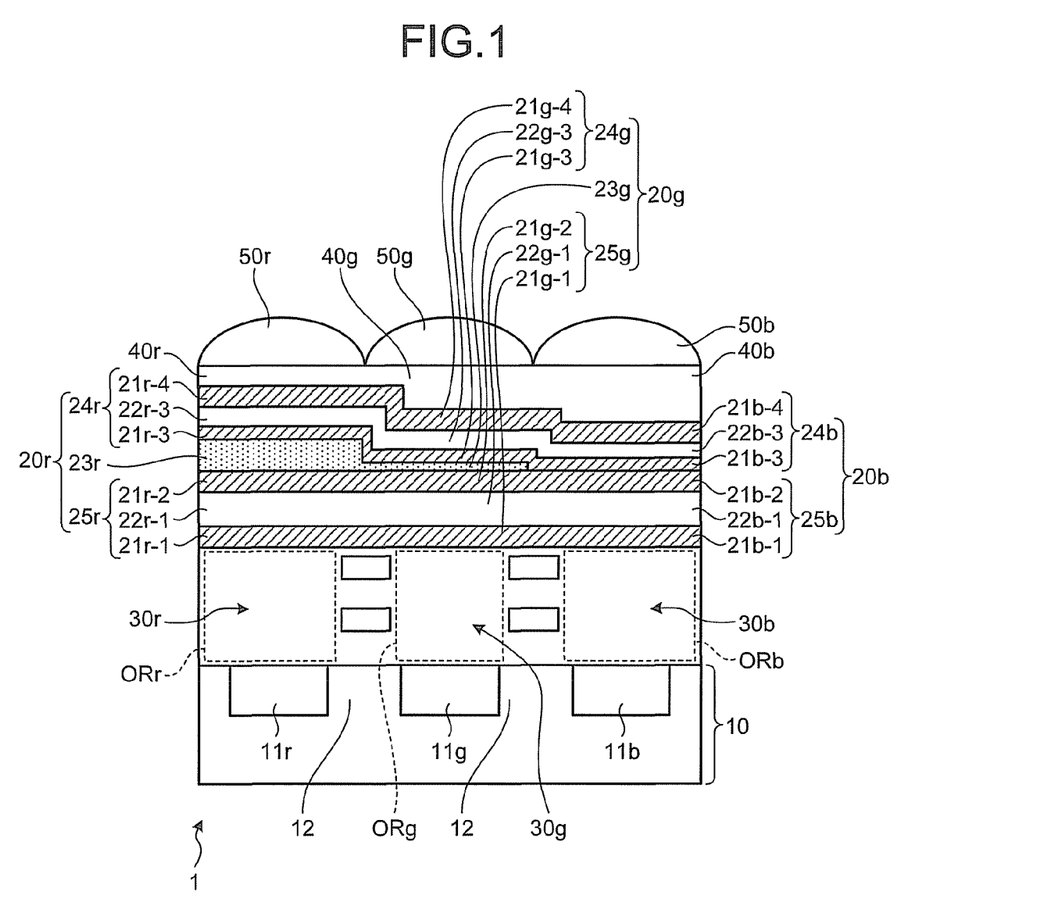
FIG. 1 is a diagram illustrating the configuration of a solid state imaging apparatus according to an exemplary embodiment.

A solid state imaging apparatus 1 according to an exemplary embodiment will be described with reference to FIG. 1. FIG. 1 is a diagram exemplarily illustrating the sectional configuration of three pixels of the solid state imaging apparatus 1 according to the exemplary embodiment. The solid state imaging apparatus 1 includes photoelectric conversion layers 11r, 11g, and 11b; multilayer wiring structures 30r, 30g, and 30b; multilayer interference filters 20r, 20g, and 20b; planarizing layers 40r, 40g, and 40b; and microlenses 50r, 50g, and 50b. Suffixes r, g, and b represent components for red (R), green (G), and blue (B), respectively.

The photoelectric conversion layers 11r, 11g, and 11b are disposed within a well region 12 of a semiconductor substrate 10. The photoelectric conversion layers 11r, 11g, and 11b receive the light of a red color (R) wavelength region, a green color (G) wavelength region, and a blue color (B) wavelength region, respectively.

The photoelectric conversion layers 11r, 11g, and 11b respectively generate electric charges according to the received light and store the generated electric charges therein. Each of the photoelectric conversion layers 11r, 11g, and 11b is, for example, a photodiode, and has a charge storage region.

The well region 12 is made of a semiconductor material (for example, silicon) containing impurities of a first conductivity type (for example, P type) at a low concentration. An example of the P type impurity includes boron (B). In each of the photoelectric conversion layers 11r, 11g, and 11b, the charge storage region is made of a semiconductor material (for example, silicon) containing impurities of a second conductivity type (for example, N type), which is the opposite conductivity type of the first conductivity type, at a concentration higher than that of the first conductivity type impurities in the well region 12. Examples of the N type impurities include phosphorous (P) and arsenic (As).

The multilayer wiring structures 30r, 30g, and 30b are disposed on the semiconductor substrate 10. Each of the multilayer wiring structures 30r, 30g, and 30b is configured such that a plurality of wiring patterns extend in interlayer insulation films. Accordingly, the multilayer wiring structures 30r, 30g, and 30b respectively define aperture regions ORr, ORg, and ORb corresponding to the photoelectric conversion layers 11r, 11g, and 11b. The interlayer insulation films are made of, for example, silicon oxide. The wiring patterns are made of, for example, metal.

The multilayer interference filter 20r is disposed on the photoelectric conversion layer 11r. Accordingly, the multilayer interference filter 20r selectively guides the light of a red color (R) wavelength region, out of the incident light. That is, the multilayer interference filter 20r serves as a color filter for a red color (R). The multilayer interference filter 20r is made of inorganic materials. The multilayer interference filter 20r, for example, is a photonic crystal type of a red filter in which inorganic materials (a low refractive index material and a high refractive index material) are laminated.

In more detail, the multilayer interference filter 20r includes an upper laminated structure 24r, an interference layer 23r, and a lower laminated structure 25r. The upper laminated structure 24r and the lower laminated structure 25r respectively serve as mirrors of which refractive surfaces face each other. In this case, as for each of the upper laminated structure 24r and the lower laminated structure 25r, the wavelength (for example, 550 nm) at the center portion of the visible light region (for example, the region of wavelengths of 400 nm to 700 nm) is used as the central wavelength (that is, the wavelength with respect to which the mirror exhibits a peak refractive index). The interference layer 23r is disposed in the interface between the upper laminated structure 24r and the lower laminated structure 25r, and causes the interference (multiple beam interference) between light beams that are multiply-reflected from the refractive surfaces of the upper laminated structure 24r and the lower laminated structure 25r. That is, the multilayer interference filter 20r operates based on the same principle as that of the Fabry-Perot interferometer.

In the upper laminated structure 24r, first layers 21r-3 and 21r-4 and a second layer 22r-3 are alternately laminated under the condition that the first and second layers have different refractive indices. In the upper laminated structure 24r, the first layer 21r-3, the second layer 22r-3, and the first layer 21r-4 are laminated, for example, in this order.

In the lower laminated structure 25r, first layers 21r-1 and 21r-2 and a second layer 22r-1 are alternately laminated. In the lower laminated structure 25r, the first layer 21r-1, the second layer 22r-1, and the first layer 21r-2 are laminated, for example, in this order.

The first layers 21r-1, 21r-2, 21r-3, and 21r-4 have a refractive index, higher than, for example, that of the second layers 22r-1 and 22r-3. The first layers 21r-1, 21r-2, 21r-3, and 21r-4 are made of, for example, titanium oxide ($TiO_2$, a refractive index of 2.5). The second layers 22r-1 and 22r-3 are made of, for example, silicon oxide ($SiO_2$, a refractive index of 1.46).

The interference layer 23r has a refractive index lower than, for example, that of the first layers 21r-1, 21r-2, 21r-3, and 21r-4. The interference layer 23r is made of, for example, silicon oxide ($SiO_2$, a refractive index of 1.46).

The upper laminated structure 24r and the lower laminated structures 25r are equal in number of laminated layers to each other. For example, the number of laminated layers in each structure is three (3). That is, in the multilayer interference filter 20r, there are six layers laminated besides the interference layer 23r. The lowermost layer of the upper laminated structure 24r (i.e., the layer contacting the upper surface of the interference layer 23r), and the uppermost layer of the lower laminated structure 25r (i.e., the layer contacting the lower surface of the interference layer 23r) are configured both by the first layers 21r-3 and 21r-2.

In the upper laminated structure 24r and the lower laminated structure 25r, some layers out of a plurality of corresponding layers are thinner than the other layers. That is, in both the upper laminated structure 24r and the lower laminated structure 25r, one first layer (the first layer 21r-3), out of a plurality of first layers 21r-1, 21r-2, 21r-3, and 21r-4, is thinner than the other first layers 21r-1, 21r-2, and 21r-4. The other first layers 21r-1, 21r-2, and 21r-4 are equal to one another in film thickness. In both of the upper laminated structure 24r and the lower laminated structure 25r, a plurality of second layers 22r-1 and 22r-3 are equal to each other in film thickness.

The multilayer interference filter 20g is disposed on the photoelectric conversion layer 11g. Accordingly, the multilayer interference filter 20g selectively guides the light of a green color (G) wavelength region, out of the incident light, to the photoelectric conversion layer 11g. That is, the multilayer interference filter 20g serves as a color filter for a green color (G). The multilayer interference filter 20g is made of inorganic materials. The multilayer interference filter 20g is, for example, a photonic crystal type of a green filter in which inorganic materials (a low refractive index material and a high refractive index material) are laminated.

In more detail, the multilayer interference filter 20g includes an upper laminated structure 24g, an interference layer 23g, and a lower laminated structure 25g. The upper laminated structure 24g and the lower laminated structure 25g serve as mirrors whose refractive surfaces face each other. In this case, as for each of the upper laminated structure 24g and the lower laminated structure 25g, the wavelength (for example, 550 nm) at the center portion of the visible light region (for example, the region of wavelengths of 400 nm to 700 nm) is used as the central wavelength (that is, the wavelength with respect to which the mirror exhibits a peak refractive index). The interference layer 23g is disposed in the interface between the upper laminated structure 24g and the lower laminated structure 25g and causes the interference (multiple beam interference) between the light beams that are multiply-reflected from the refractive surfaces of the upper laminated structure 24g and the lower laminated structure 25g. That is, the multilayer interference filter 20g operates based on the same principle as that of the Fabry-Perot interferometer.

In the upper laminated structure 24g, first layers 21g-3 and 21g-4 and a second layer 22g-3 are alternately laminated under the condition that the first layer and the second layer have different refractive indices. In the upper laminated structure 24g, for example, the first layer 21g-3, the second layer 22g-3, and the first layer 21g-4 are laminated in this order.

In the lower laminated structure 25g, first layers 21g-1 and 21g-2 and a second layer 22g-1 that have different refractive indices are alternately laminated. In the lower laminated structure 25g, for example, the first layer 21g-1, the second layer 22g-1, and the first layer 21g-2 are laminated in this order.

The first layers 21g-1, 21g-2, 21g-3, and 21g-4 have a refractive index, for example, higher than a refractive index of the second layers 22g-1 and 22g-3. The first layers 21g-1, 21g-2, 21g-3, and 21g-4 are made of, for example, titanium oxide ($TiO_2$, a refractive index of 2.5). The second layers 22g-1 and 22g-3 are made of, for example, silicon oxide ($SiO_2$, a refractive index of 1.46).

The refractive index of the interference layer 23g is lower than that of the first layers 21g-1, 21g-2, 21g-3, and 21g-4. The interference layer 23g is made of, for example, silicon oxide ($SiO_2$, a refractive index of 1.46).

The upper laminated structure 24g and the lower laminated structure 25g are equal in number of laminated layers to each other. For example, the number is three (3). That is, the multilayer interference filter 20g includes six (6) laminated layers besides the interference layer 23g. The lowermost layer of the upper laminated structure 24g (i.e., the layer contacting the upper surface of the interference layer 23g), and the uppermost layer of the lower laminated structure 25g (i.e., the layer contacting the lower surface of the interference layer 23g) are configured by the first layers 21g-3 and 21g-2.

In the upper laminated structure 24g and the lower laminated structure 25g, some layers, out of a plurality corresponding layers therein, are thinner than the other layers. That is, in each of the upper laminated structure 24g and the lower laminated structure 25g, one first layer (i.e., the first layer 21g-3) out of a plurality of first layers 21g-1, 21g-2, 21g-3, and 21g-4 is thinner than the other first layers 21g-1, 21g-2, and 21g-4. The other first layers 21g-1, 21g-2, and 21g-4 are equal in film thickness to one another. In both of the upper laminated structure 24g and the lower laminated structure 25g, a plurality of second layers 22g-1 and 22g-3 are equal in film thickness to each other.

The multilayer interference filter 20b is disposed on the photoelectric conversion layer 11b. Accordingly, the multilayer interference filter 20b selectively guides the light of a blue color (B) wavelength region, out of the incident light, to the photoelectric conversion layer 11b. That is, the multilayer interference filter 20b serves as a color filter for a blue color (B). The multilayer interference filter 20b is made of inorganic materials. The multilayer interference filter 20b is a photonic crystal type of a blue filter in which organic materials (a low refractive index material and a high refractive index material) are laminated.

Specifically, in a case where the interference layer is actually not incorporated, it is assumed that the interference layer is imaginarily present, with a film thickness of 0 nm. Under such assumption, the multilayer interference filter 20b includes an upper laminated structure 24b, an interference layer 23b (with an imaginary film thickness of 0 nm) and a lower laminated structure 25b. The upper laminated structure 24b and the lower laminated structure 25b respectively serve as mirrors whose refractive surfaces face each other. In this case, in the upper laminated structure 24b and the lower laminated structure 25b, the wavelength (for example, 550 nm) at the center portion of the visible light region (for example, the wavelengths of 400 nm to 700 nm) is the central wavelength (that is, the wavelength with respect to which the mirror exhibits a peak refractive index). The interference layer 23b is disposed in the interface between the upper laminated structure 24b and the lower laminated structure 25b and causes interference (multiple beams interference) between the lights that are multiply-reflected from the refractive surfaces of the upper laminated structure 24b and the lower laminated structure 25b. That is, the multilayer interference filter 20b operates based on the same principle as that of the Fabry-Perot interferometer.

In the upper laminated structure 24b, first layers 21b-3 and 21b-4 and a second layer 22b-3 are alternately laminated under the condition that the first layer and the second layer have the different refractive indices. In the upper laminated structure, for example, the first layer 21b-3, the second layer 22b-3, and the first layer 21b-4 are laminated in this order.

In the lower laminated structure 25b, first layers 21b-1 and 21b-2 and a second layer 22b-1 are alternately laminated under the condition that the first layer and the second layer have different refractive indices. In the lower laminated structure 25b, for example, the first layer 21b-1, the second layer 22b-1, and the first layer 21b-2 are laminated in this order.

The first layers 21b-1, 21b-2, 21b-3, and 21b-4 have a refractive index, for example, higher than a refractive index of the second layers 22b-1 and 22b-3. The first layers 21b-1, 21b-2, 21b-3, and 21b-4 are made of, for example, titanium oxide ($TiO_2$, a refractive index of 2.5). The second layers 22b-1 and 22b-3 are made of, for example, silicon oxide ($SiO_2$, a refractive index of 1.46).

The refractive index of the interference layer 23b (with an imaginary film thickness of 0 nm) is lower than that of the first layers 21b-1, 21b-2, 21b-3, and 21b-4. The interference layer 23b is made of, for example, silicon oxide ($SiO_2$, a refractive index of 1.46).

The upper laminated structure 24b and the lower laminated structure 25b are equal, in number of laminated layers, to each other, and the number of laminated layers is, for example, three (3). That is, the multilayer interference filter 20b includes 6 laminated layers besides the imaginary interference layer 23b. The lowermost layer of the upper laminated structure 24b (i.e., the layer contacting the upper surface of the interference layer 23b), and the uppermost layer of the lower laminated structure 25b (i.e., the layer contacting the lower surface of the interference layer 23b) are configured by the first layers 21b-3 and 21b-2.

In the upper laminated structure 24b and the lower laminated structure 25b, some layers out of a plurality of corresponding layers are thinner than the other layers. That is, the upper laminated structure 24b and the lower laminated structure 25b are structured such that in both structures, one first layer (the first layer 21b-3) out of a plurality of first layers 21b-1, 21b-2, 21b-3, and 21b-4 is thinner than the other first layers 21b-1, 21b-2, and 21b-4. The other first layers 21b-1, 21b-2, and 21b-4 are equal, in film thickness, to one another. In both of the upper laminated structure 24b and the lower laminated structure 25b, a plurality of second layers 22b-1 and 22b-3 are equal to each other in film thickness.

The planarizing layers 40r, 40g, and 40b cover the multilayer interference filters 20r, 20g, and 20b, respectively. Accordingly, the planarizing layers 40r, 40g, and 40b reduce the steps among the multilayer interference filters 20r, 20g, 20b and provide the flat surface. The planarizing layers 40r, 40g, and 40b are made of, for example, a predetermined resin or an oxide film (for example, $SiO_2$).

The microlenses 50r, 50g, and 50b are disposed on the planarizing layers 40r, 40g, and 40b, respectively. With such an arrangement, the microlenses 50r, 50g, and 50b selectively collect the incident light respectively in the photoelectric conversion layers 11r, 11g, and 11b via the multilayer interference filters 20r, 20g, and 20b. The microlenses 50r, 50g, and 50b are made of, for example, a predetermined resin.

As described above, in regard with the upper laminated structure and the lower laminated structure in each of the multilayer interference filters 20r, 20g, and 20b, some layers out of a plurality of corresponding layers in both structures are thinner than the other layers, and the other layers are equal in film thickness to one another. For example, in the multilayer interference filter 20r, the upper laminated structure 24r and the lower laminated structure 25r are configured such that in both structures, one fist layer (the first layer 21r-3) out of a plurality of corresponding first layers 21r-1, 21r-2, 21r-3, and 21r-4 is thinner than the other first layers 21r-1, 21r-2, and 21r-4. Further, in the upper laminated structure 24r and the lower laminated structure 25r, the other first layers 21r-1, 21r-2, and 21r-4 are in equal in film thickness to one another, and the corresponding second layers 22r-1 and 22r-3 are equal in film thickness to one another. That is, in regard with each of the multilayer interference filters 20r, 20g, and 20b, when the basic configuration is considered such that the upper laminated structure and the lower laminated structure are symmetric to each other with respect to the interface between the upper laminated structure and the lower laminated structure, each filter has an asymmetric configuration in which one of the first layers is modified to be relatively thin as compared with that of the basic configuration.

In other words, in each of the multilayer interference filters 20r, 20g, and 20b, in regard with the upper laminated structure and the lower laminated structure, when two layers disposed at the corresponding positions in the upper and lower laminated structures form a layer set, within some layer sets out of a plurality of layer sets, one layer of the corresponding two layers in a layer set is thinner than the other layer. For example, in the multilayer interference filter 20r, the upper laminated structure 24r and the lower laminated structure 25r include a first layer set composed of the first layer 21r-3 and the first layer 21r-2 disposed at the corresponding positions, a second layer set composed of the second layer 22r-1 and the first layer 22r-3 disposed at the corresponding positions, and a third layer set composed of the first layer 21r-1 and the first layer 21r-4 disposed at the corresponding positions. In this case, in the first layer set among the first to third layer sets, the first layer 21r-3, which is one layer of two corresponding layers, is thinner than the first layer 21r-2 which is the other layer of the two corresponding layers. On the other hand, in regard with the second and third layer sets, two first layers are equal in film thickness to each other. Accordingly, the upper laminated structure 24r and the lower laminated structure 25r are asymmetric to each other with respect to the interface between the upper laminated structure 24r and the lower laminated structure 25r.

In addition, the multilayer interference filters 20r, 20g, and 20b are made to differ in transmission bands from one another by the presence or absence of the interference layer in the interface between the upper laminated structure and the lower laminated structure, and the difference in the film thickness of the interference layer. For example, when it is assumed that the interference layer is imaginarily present with a film thickness of 0 nm even though the interference layer does not exist actually, if the film thicknesses of the interference layers of the respective multilayer interference filters 20r, 20g, and 20b are set to, for example, 85 nm, 35 nm, and 0 nm, respectively, the filters exhibit the spectral transmittance peak in wavelength bands of red, green, and blue colors, respectively (see FIGS. 2A and 2B).

Next, a method of manufacturing the solid state imaging apparatus 1 according to the exemplary embodiment will be described with reference to FIGS. 3A to 3C, 4A to 4B, and 1. FIGS. 3A to 3C and 4A to 4B are sectional views illustrating process steps of the manufacturing method of the solid state imaging apparatus 1 according to the exemplary embodiment. FIG. 1 is considered to be a sectional view of a process step subsequent to the process step of FIG. 4B.

Figure 3A:
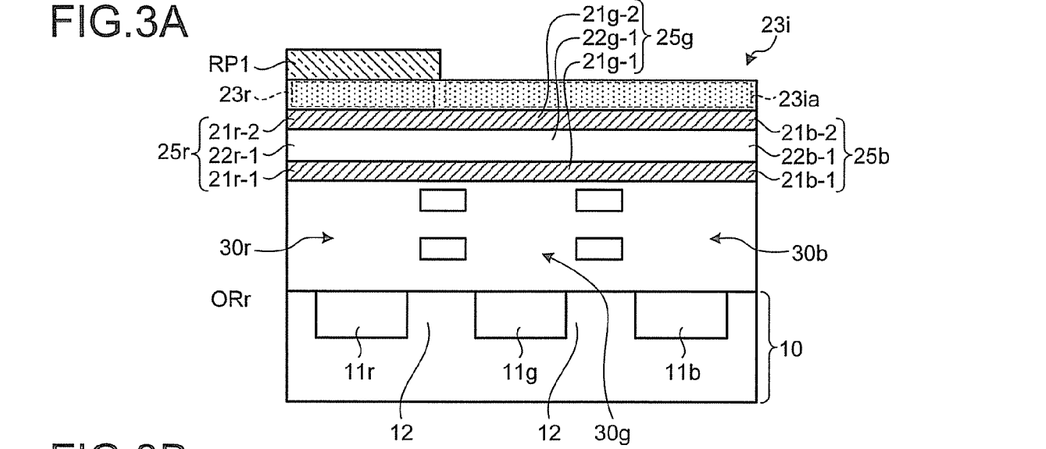

In the process step shown in FIG. 3A, an ion implantation method is performed to form photoelectric conversion layers 11r, 11g, and 11b, each including a charge storage region, within a well region 12 of a semiconductor substrate 10. The well region 12 is made of a semiconductor material (for example, silicon) containing impurities of a first conductivity type (for example, P type) at a low concentration. The charge storage region of each of the photoelectric conversion layers 11r, 11g, and 11b is formed by implanting impurities of a second conductivity type (for example, N type), which is the opposite conductivity type of the first conductivity type, into the well region 12 of the semiconductor substrate 10 at a concentration higher than that of the first conductivity type impurities in the well region 12.

A CVD method or the like is performed to form an interlayer insulation film covering the semiconductor substrate 10. For example, the interlayer insulation film is formed by depositing $SiO_2$. Then, a wiring pattern is formed on the interlayer insulation film, with use of a metal, through a sputtering method, a lithography method, and the like. Then, an interlayer insulation film is formed to cover the former interlayer insulation film and the wiring pattern, with use of $SiO_2$, by a CVD method. These processes are repeated a given number of times. As a result, the multilayer wiring structures 30r, 30g, and 30b are obtained.

Next, formed are lower laminated structures 25r, 25g, and 25b as lower parts of the multilayer interference filters 20r, 20g, and 20b. In more detail, simultaneous deposition of the first layers 21r-1, 21g-1, and 21b-1, simultaneous deposition of the second layers 22r-1, 22g-1, and 22b-1, and simultaneous deposition of the first layers 21r-2, 21g-2, and 21b-2 are sequentially performed to produce the laminated structures. Each of the first layers 21r-1 to 21b-2 is formed with use of, for example, titanium oxide ($TiO_2$) by a sputtering method or the like. The respective first layers 21r-1 to 21b-2 are formed to have the same film thickness. Each of the respective first layers 21r-1 to 21b-2 is formed to such a film thickness that the optical film thickness thereof is equal to a quarter (¼) of the central wavelength (for example, 550 nm). That is, when it is assumed that the refractive index of a material (for example, $TiO_2$) is n1, and the central wavelength is λ; each of the first layers 21r-1 to 21b-2 has the film thickness d1 that satisfies the following Formula.

$$n1 \times d1 = (¼) \times \lambda \quad \text{(Formula 1)}$$

For example, when substituting n1=2.5 and λ=550 nm into the Formula 1, obtained is d1=55 nm. The second layers 22r-1, 22g-1, and 22b-1 are formed with use of silicon oxide ($SiO_2$) by a CVD method. Each of the second layers 22r-1, 22g-1, and 22b-1 is formed to such a thickness that the optical film thickness thereof is equal to a quarter (¼) of the central wavelength (for example, 550 nm). That is, when the refractive index of a material (for example, $SiO_2$) is n2, and the central wavelength is λ; each of the second layers 22r-1, 22g-1, and 22b-1 has a film thickness d2 that satisfies the following Formula.

$$n2 \times d2 = (¼) \times \lambda \quad \text{(Formula 2)}$$

For example, when substituting n2=1.46 and λ=550 nm into the Formula 2, obtained is d2=94 nm.

As a result, the lower laminated structure 25r is formed in which the first layer 21r-1, the second layer 22r-1, and the first layer 21r-2 are laminated in this order. In addition, the lower laminated structure is formed in which the first layer 21g-1, the second layer 22g-1, and the first layer 21g-2 are laminated in this order. Furthermore, the lower laminated structure 25b is formed in which the first layer 21b-1, the second layer 22b-1, and the first layer 21b-2 are formed in this order.

Next, a layer 23i to become the interference layers 23r and 23g are formed, by a CVD method or the like, on the first layers 21r-1, 21g-1, and 21b-1. The layer 23i is formed to a film thickness (for example, 85 nm) corresponding to a red color wavelength band. Next, a resist pattern RP1 is formed, by a lithography method, on the layer 23i, in particular so as to cover a portion (to be the interference layer 11r) of the layer 23i which correspondingly overlies on the photoelectric conversion layer 11r. In this case, another portion of the layer 23i, that is, the overlying portion 23ia corresponding to the photoelectric conversion layers 11g and 11b are exposed.

Figure 3B:
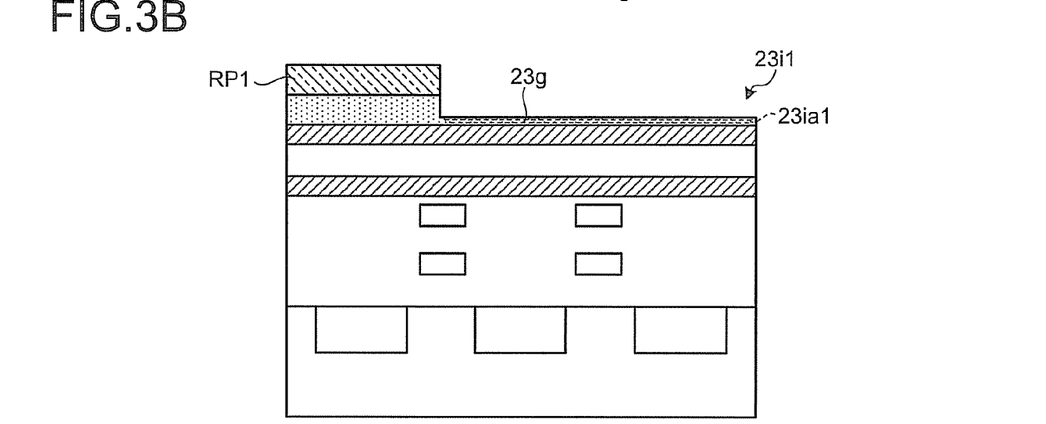

In the process step shown in FIG. 3B, a dry etching method is performed using the resist pattern RP1 as an etching mask, in order to etch (half-etch) the overlying portion 23ia1 of the layer 23i1 that corresponds to the photoelectric conversion layers 11g and 11b so that the overlying portion 23ia1 is made thin to have a film thickness (for example, 35 nm) corresponding to a green wavelength band. With these processes, the interference layer 23g is formed in a portion of the layer 23i1 which corresponds to the photoelectric conversion layer 11g. Then, removal of the resist pattern RP1 is followed.

Figure 3C:
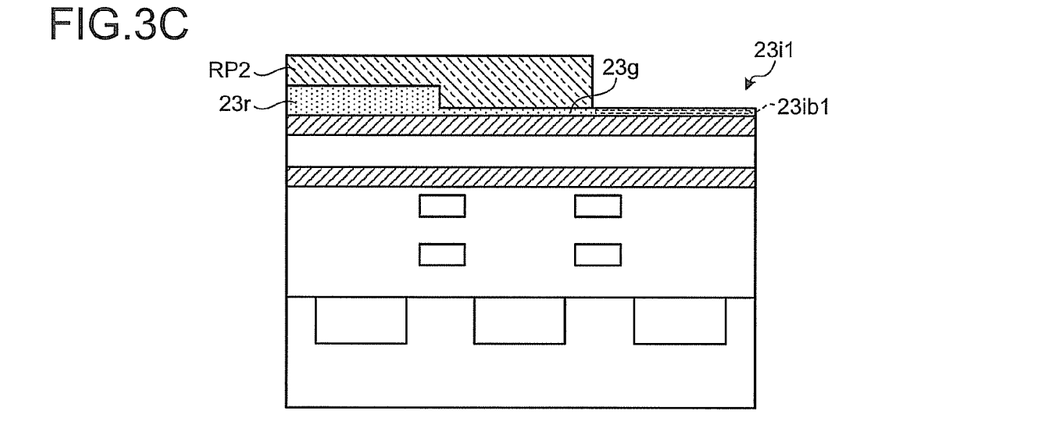

In the process step shown in FIG. 3C, a resist pattern RP2 is formed, by a lithography method, on the layer 23i1, in particular so as to cover a portion (to be the interference layer 23r and the interference layer 23g) of the layer 23i1 which correspondingly overlies on the photoelectric conversion layers 11r and 11g. In this case, the overlying portion of the layer 23i1 which corresponds to the photoelectric conversion layer 11b is exposed.

Figure 4A:
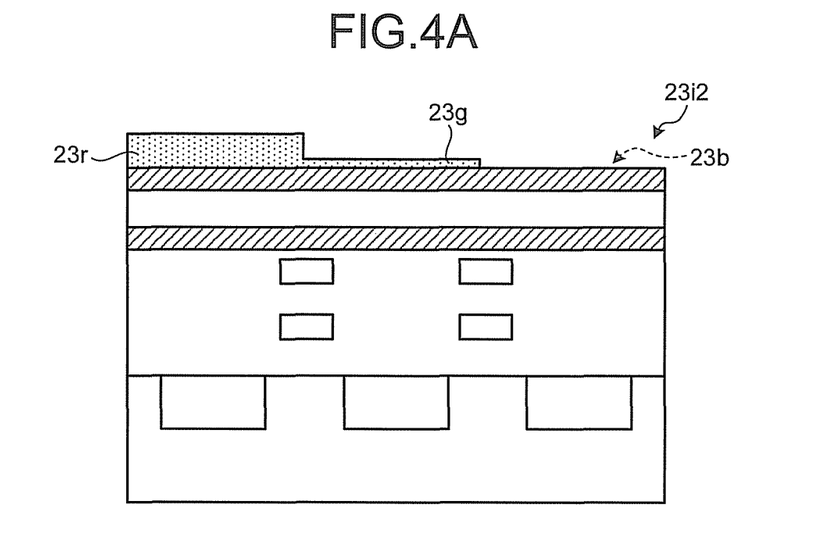

In the process step shown in FIG. 4A, a dry etching method is performed using the resist pattern RP2 as an etching mask, in order to etch and remove a portion of the layer 23i1 that corresponds to the photoelectric conversion layers 11b. With this process, an imaginary interference layer 23b having a film thickness of 0 nm is formed in the layer 23i2, in particular at the portion corresponding to photoelectric conversion layer 11b, but leaving the interference layer 23r and the interference layer 23g. Then, removal of the resist pattern RP2 is followed.

Figure 4B:
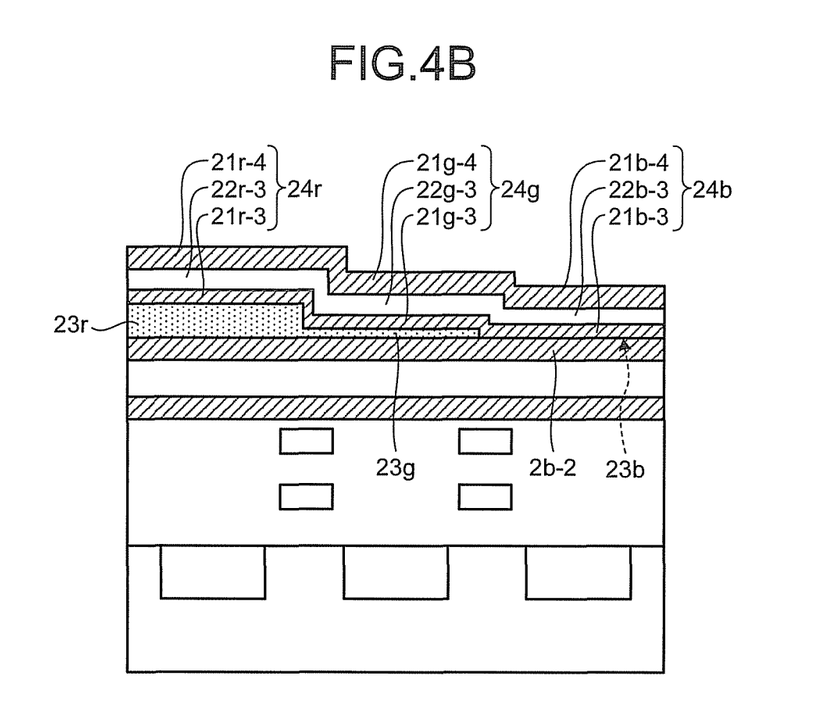

In the process step shown in FIG. 4B, formed are upper laminated structures 24r, 24g, and 24b as upper parts of the multilayer interference filters 20r, 20g, and 20b, respectively. In more detail, simultaneous deposition of the first layers 21r-3, 21g-3, and 21b-3, simultaneous deposition of the second layers 22r-3, 22g-3, and 22b-3, and simultaneous deposition of the first layers 21r-4, 21g-4, and 21b-4 are sequentially performed to produce the laminated structures.

The first layers 21r-3 to 21b-4 are formed with use of, for example, titanium oxide (TiO$_2$) by a sputtering method or the like. Each of the first layers 21r-3, 21g-3, and 21b-3 is formed to a film thickness thinner than that of each of the first layers 21r-1 to 21b-2 (see FIG. 3A) and the first layers 21r-4, 21g-4, and 21b-4. Each of the first layers 21r-4, 21g-4, and 21b-4 is formed to have the same thickness as that of each of the first layers 21r-1 to 21b-2 (see FIG. 3A). Each of the first layers 21r-1, 21g-3, and 21b-3 is formed to have such film thickness that the optical film thickness thereof is thinner than a quarter (¼) of the central wavelength (for example, 550 nm). That is, each of the first layers 21r-3, 21g-3, and 21b-3 is formed to a film thickness (for example, 25 nm) smaller than the film thickness d1 that satisfies the Formula 1, and each of the first layers 21r-4, 21g-4, and 21b-4 is formed to a film thickness d1 (for example, d1=55 nm) that satisfies the Formula 1. Each of the second layers 22r-3, 22g-3, and 22b-3 are formed with use of, for example, silicon oxide (SiO$_2$) by a CVD method or the like. Each of the second layers 22r-3, 22g-3, and 22b-3 is formed to have the same film thickness as that of each of the second layers layer 22r-1, 22g-1, and 22b-1 (see FIG. 3A). Each of the second layers 22r-3, 22g-3, and 22b-3 is formed to such film thickness that the optical film thickness thereof is equal to a quarter (¼) of the central wavelength (for example, 550 nm). That is, each of the second layers 22r-3, 22g-3, and 22b-3 is formed to the film thickness d2 (for example, d2=94 nm) that satisfies the Formula 2.

As a result, on the interference layer 23r is formed the upper laminated structure 24r in which the first layer 21r-3, the second layer 22r-3, and the first layer 21r-4 are laminated in this order. That is, obtained is the multilayer interference filter 20r including the upper laminated structure 24r, the interference layer 23r, and lower laminated structure 25r. In addition, on the interference layer 23g is formed the upper laminated structure 24g in which the first layer 21g-3, the second layer 22g-3, and the first layer 21g-4 laminated in this order. That is, obtained is the multilayer interference filter 20g including the upper laminated structure 24g, the interference layer 23g, and the lower laminated structure 25g. Furthermore, the upper laminated structure 24b in which the first layer 21b-3, the second layer 22b-3, and the first layer 21b-4 laminated in this order is formed on the first layer 21b-2 (i.e., on the imaginary interference layer 23b with a film thickness of 0 nm). That is, obtained is the multilayer interference filter 20b including the upper laminated structure 24b, (the interference layer 23b,) and the lower laminated structure 25.

In the process step shown in FIG. 1, a film such as a resin film or an oxide film (for example, SiO$_2$) is formed by a deposition method so as to cover the multilayer interference filters 20r, 20g, and 20b, and the surface of the formed film is planarized by a CMP method. As a result, the planarizing layers 40r, 40g, and 40b having the flat surfaces are formed. Next, microlenses 50r, 50g, and 50b are formed on the planarizing layers 40r, 40g, and 40b with use of a predetermined resin.

As a result, the solid state imaging apparatus 1 is produced which includes the multilayer interference filters 20r, 20g, and 20b, each having the asymmetric configuration in which the upper laminated structure and the lower laminated structure are asymmetric to each other with respect to the interface between the upper laminated structure and the lower laminated structure.

Figure 7A:
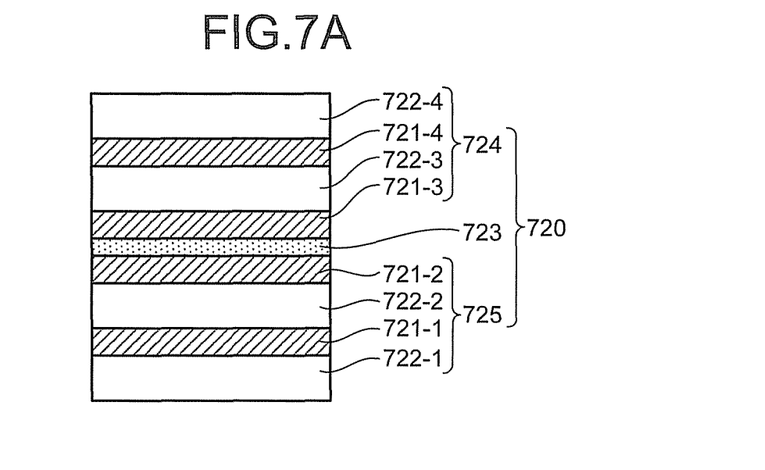
FIGS. 7A and 7B are diagrams illustrating comparative examples.

Here, as shown in FIG. 7A, there may be considered a solid state imaging apparatus including a multilayer interference filter 720 where a wavelength (for example, 550 nm) at the center portion of the visible light region is used as a central wavelength, and an upper laminated structure 724 and a lower laminated structure 725 are symmetric to each other with respect to the interface (or with respect to the interference layer 723 disposed in the interface) between the upper laminated structure 724 and the lower laminated structure 725. In this case, the upper laminated structure 724 and the lower laminated structure 725 are configured such that a plurality of corresponding first layers 721-1 to 721-4 in both structures are equal to each other in film thickness (the film thickness corresponding to an optical film thickness of a quarter (¼) of the central wavelength).

Figure 7B:
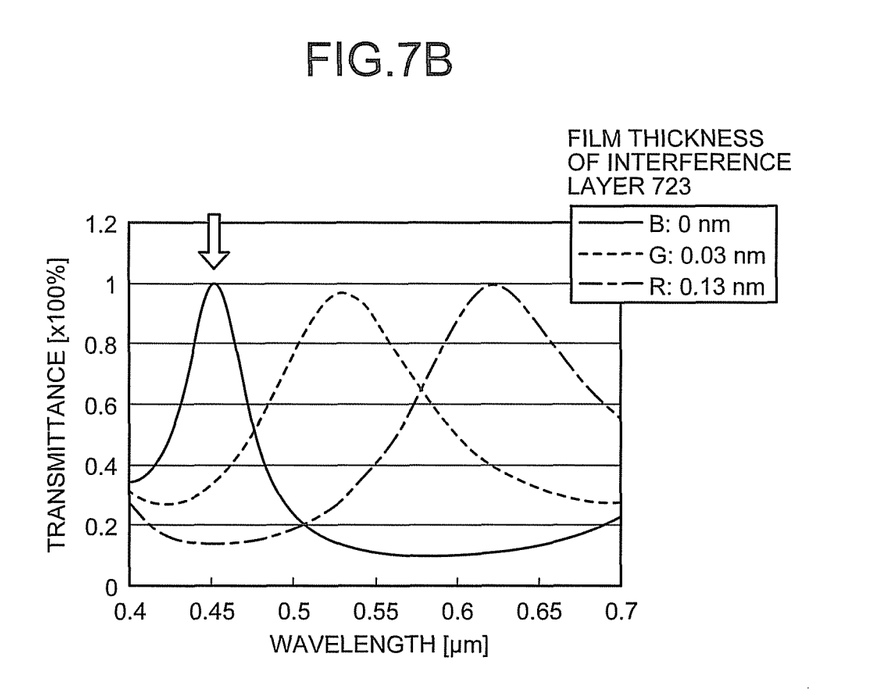

In such configuration, in a case where the thicknesses of the interference layers 723 are set to 0 nm, 0.03 nm, 0.13 nm, respectively, as shown in FIG. 7B, the peak of the first order of the spectral transmittance of the multilayer interference filter 720 appears in the green color (G) wavelength band, the red color (R) wavelength band, and the infrared wavelength band, respectively. That is, when the thickness of the interference layer 723 is 0.13 nm, the peak of the higher order (for example, second order) than the first order of the spectral transmittance of the multilayer interference filter 720 appears in the blue (B) wavelength band. In this manner, in a case where a spectral transmittance peak appears at the wavelength shorter than the central wavelength, the peak of the first order cannot be used as the spectral transmittance peak and as a result, only the peak of the higher order than the first order can be used. Accordingly, the spectrum width of the transmittance is likely to be narrow. Due to this, in the solid state imaging apparatus, the photoelectric conversion layer corresponding to the multilayer interference filter for a color of a wavelength shorter than the central wavelength cannot receive a sufficient amount of light that is required to obtain a given sensitivity, and this is highly likely to result in weak sensitivity.

Figure 2A:
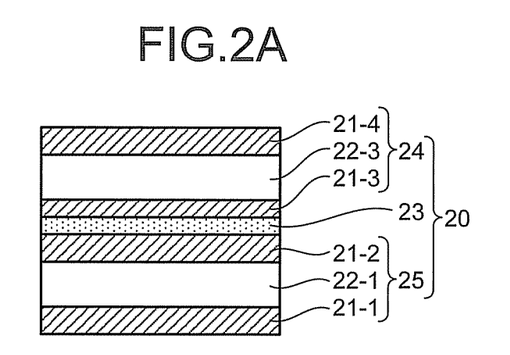
FIGS. 2A and 2B are diagrams illustrating the configuration and properties of a multilayer interference filter.

In contrast, according to the exemplary embodiment, as shown in FIG. 2A, the central wavelength of the multilayer interference filter 20 of the solid state imaging apparatus 1 is the wavelength (for example, 550 nm) at the center portion of the visible light region; and the upper laminated structure 24 and the lower laminated structure 25 are asymmetric to each other with respect to the interface (or the interference layer 23 disposed in the interface) between the upper laminated structure 24 and the lower laminated structure 25. That is, in regard with the multilayer interference filter 20, the upper laminated structure and the lower laminated structure are configured such that some layers out of a plurality of corresponding layers disposed at the corresponding positions in both the laminated structures are thinner than the other layers, and the layers other than the above-mentioned some layers are equal, in the film thickness, to one another. In more detail, the upper laminated structure 24 and the lower laminated structure 25 are configured such that one layer of the first layer 21-3 out of a plurality of first layers 21-1 to 21-4 in both laminated structure is thinner than any of the other first layers 21-1, 21-2, and 21-4 (for example, the film thickness of the first layer 21-3 is 25 nm). In still more detail, the first layer 21-3 as the lowermost layer of the upper laminated structure 24 is thinner than another first layer 21-4 of the upper laminated structure 24, and also thinner than the first layers 21-1 and 21-2 of the lower laminated structure 25. Accordingly, in the upper laminated structure 24 and the lower laminated structure 25, the first layers 21-1, 21-2, and 21-4 other than the first layer 21-3 are equal to each other in the film thickness (for example, 55 nm), and the second layers 22-1 and 22-3 are equal to each other in the film thickness (for example, 94 nm). That is, in regard with the multilayer interference filter 20, when the basic configuration is such that the upper laminated structure and the lower laminated structure are symmetric to each other with respect to the interface between the upper laminated structure and the lower laminated structure, the multilayer interference filter 20 has an asymmetric configuration in which one first layer (for example, the first layer 21-3) out of the first layers is modified to be relatively thin as compared with that of the basic configuration.

Figure 2B:
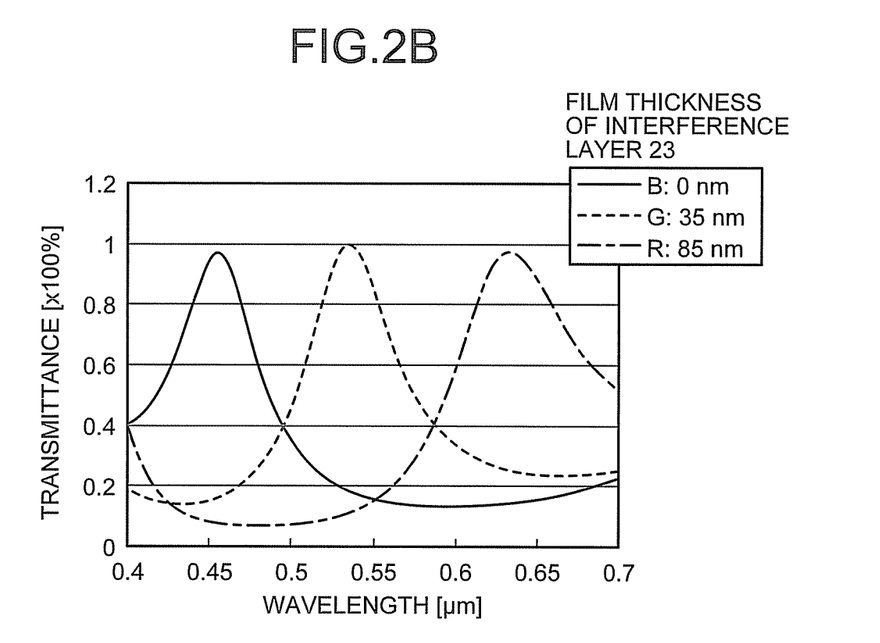

With such a configuration, in a where the thicknesses of the interference layers 23 are set to 0 nm, 35 nm, and 85 nm, respectively, as shown in FIG. 2B, the peak of the first order of the spectral transmittance of the multilayer interference filter 20 appears in a blue (B) wavelength band, a green (G) wavelength band, and a red (R) wavelength band, respectively. That is, in a case where the interference layer 23 is not incorporated (where it is imaginarily assumed that the thickness is 0 nm), the peak of the first order of the spectral transmittance of the multilayer interference filter 20 appears in the blue (B) wavelength band. As such, in a case where the peak of the spectral transmittance is made to appear in the band of wavelengths shorter than the central wavelength, the peak of the first order can be used as the spectral transmittance peak, and thus the spectrum width becomes broad. Accordingly, in the solid state imaging apparatus 1, the photoelectric conversion layer corresponding to the multilayer interference filter for a color (for example, a blue color (B)) of a wavelength shorter than the central wavelength can receive a sufficient amount of light that is required to obtain a given sensitivity, and as a result, it is possible to improve the sensitivity. That is, it is possible to improve the sensitivity of the photoelectric conversion layer corresponding to the multilayer interference filter for a color (for example, a blue color) of a wavelength shorter than the central wavelength.

Figure 8A:
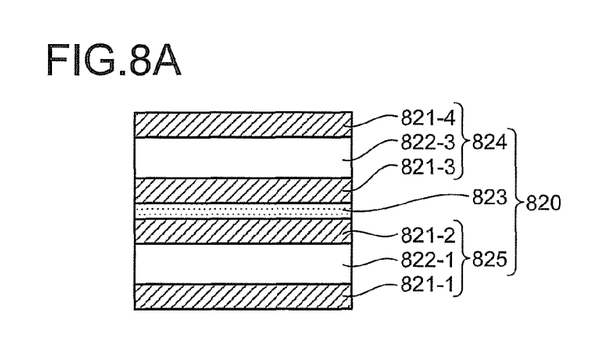
FIGS. 8A to 8D are diagrams illustrating other comparative examples.

Alternatively, as shown in FIG. 8A, there may be considered a solid state imaging apparatus including a multilayer interference filter 820 where a wavelength (for example, 450 nm) on the shorter wavelength side of the visible light region is used as the central wavelength, and an upper laminated structure 824 and a lower laminated structure 825 are symmetric to each other with respect to an interface (or an interference layer 823 disposed in the interface) between the upper laminated structure 824 and the lower laminated structure 825. In this case, in the upper laminated structure 824 and the lower laminated structure 825, a plurality of first layers 821-1 to 821-4 in both laminated structures are equal to each other in film thickness (the film thickness corresponding to an optical film thickness equal to a quarter (¼) of the central wavelength) and a plurality of second layers 822-1 and 822-3 in both laminated structures are also equal to each other in film thickness (the film thickness corresponding to the optical film thickness equal to a quarter (¼) of the central wavelength).

Figures 8B, 8D:
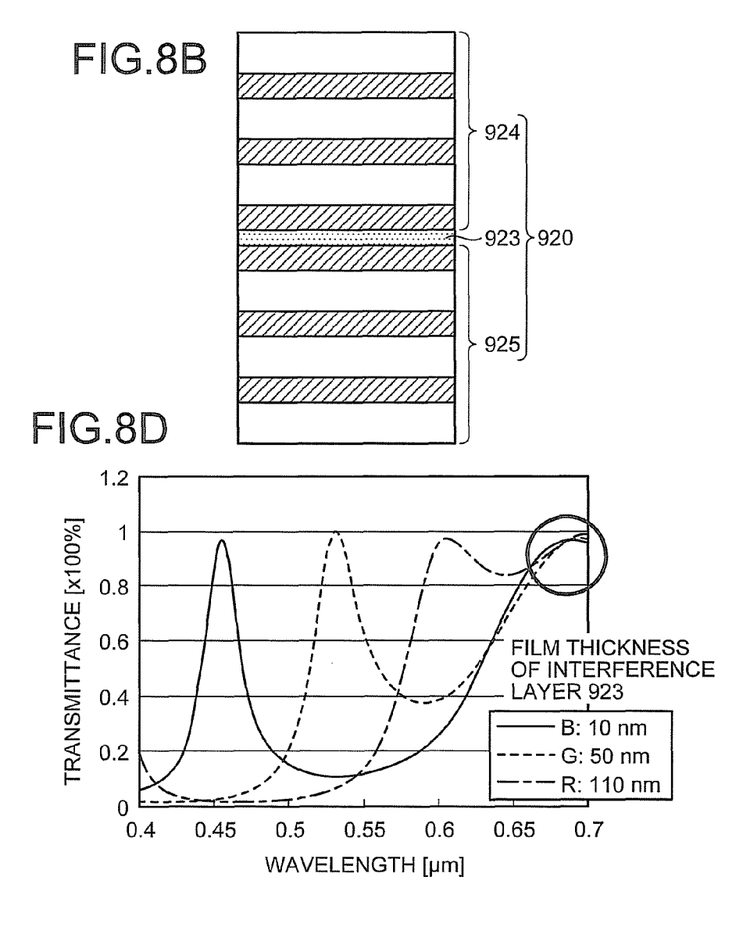
Figure 8C:
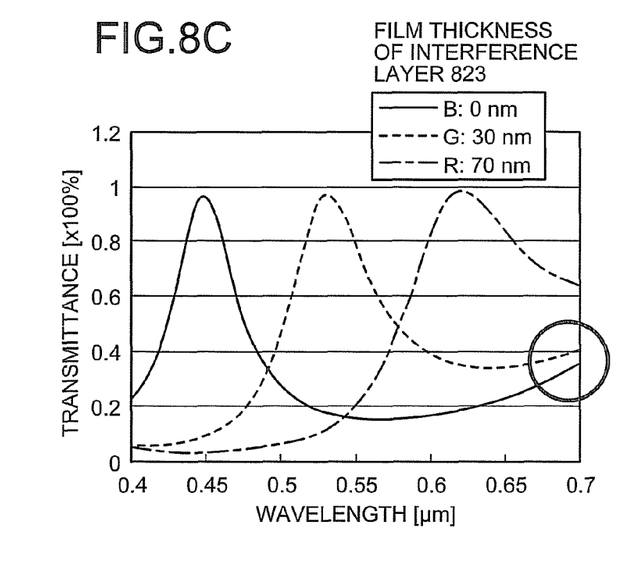

In regard with this configuration, in a case where the thicknesses of the interference layers 823 are 0 nm, 30 nm, and 70 nm, respectively, as shown in FIG. 8C, the peak of the first order of the spectral transmittance of the multilayer interference filters 820 appear in a blue color (B) wavelength band, a green color (G) wavelength band, and a red color (R) wavelength band, respectively, and, in each transmittance spectrum, the crosstalk increases, resulting in the tendency of deterioration in spectral characteristics. As shown in FIGS. 8B and 8D, this tendency becomes more noticeable when the number of laminated layers (6 layers) in each of an upper laminated structure 924 and the number of laminated layers (6 layers) of a lower laminated structure 925 are increased while the symmetry between the upper laminated structure 924 and the lower laminated structure 925 of the multilayer interference filter 920 is maintained. That is, in order to make a filter to exhibit the spectral transmittance peak for the short wavelength side of the visible light region as compared to the central wavelength, if the central wavelength is shifted to the short wavelength side, it may not be possible to meet the spectral characteristics required.

In contrast, according to the exemplary embodiment, since the multilayer interference filter 20 of the solid state imaging apparatus 1 uses a wavelength (for example, 550 nm) at the center portion of the visible light region as the central wavelength, in each transmittance spectrum, the cross-talk level of the long wavelength region is suppressed to be low, and thus it may be possible to meet the spectral characteristics required.

In the multilayer interference filter, when the basic configuration is such that the upper laminated structure and the lower laminated structure are symmetric to each other with respect to the interface, the filter has an asymmetric configuration in which one first layer 21-3 is modified to be relatively thin as compared with that of the basic configuration. Accordingly, the total film thickness of the multilayer interference filter 20 is small as compared to the basic configuration, and thus the filter has a structure that is advantageous in terms of deterioration by noise, such as the mixing of colors. As compared to a method of manufacturing the basic structure, the filter can be manufactured without an increase in the number of manufacturing process steps by changing the thicknesses of some layers. Accordingly, the cost increase is suppressed.

Furthermore, when it is compared with the structure shown in FIG. 7A, the number of layers in the multilayer interference filter 20 is smaller, and the total film thickness of the multilayer interference filter 20 is smaller (thinner), so that the filter of the embodiment has the structure which is advantageous in terms of the deterioration by noise such as the mixing of colors.

The solid state imaging apparatus 1 may be configured such that a plurality of pixels are arranged one-dimensionally, or such that a plurality of pixels are arranged two-dimensionally. In a case where a plurality of pixels are arranged two-dimensionally, the multilayer interference filter may be processed and formed in a desired size and layout, complying with the specification of the image sensor. For example, R pixels, G pixels, and B pixels shown in FIG. 1 may be arranged according to Bayer arrangement.

In addition, the photoelectric conversion layers 11r, 11g, and 11b may be types other than photodiodes. For example, an organic film or an inorganic film may be present between the semiconductor substrate 10 and each of the multilayer interference filters 20r, 20g, and 20b.

In the above exemplary embodiment, the description is made with a case where the solid state imaging apparatus is a front side illumination type image sensor. However, the multilayer interference filter of the above-described exemplary embodiment may be also applied to a case where the solid state imaging apparatus is a back side illumination type image sensor.

Figure 5A:
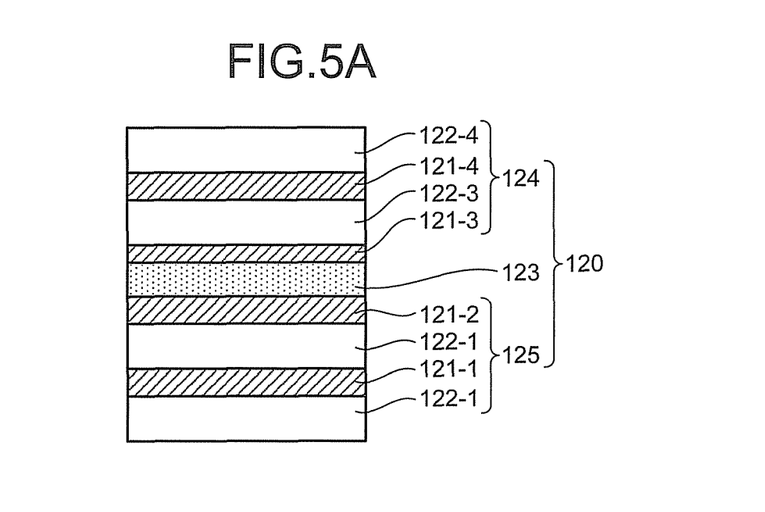
FIGS. 5A and 5B are diagrams illustrating the configuration and properties of a multilayer interference filter according to a modification of the exemplary embodiment.

In addition, as shown in FIG. 5A, in regard with a multilayer interference filter 120 provided in a solid state imaging apparatus, each of the number of laminated layers in an upper laminated structure 124 and the number of laminated layers in a lower laminated structure 125 may be four. That is, the multilayer interference filter 120 may include 8 layers besides an interference layer 123. In more detail, the lower laminated structure 125 includes a second layer 122-1, a first layer 121-1, a second layer 122-2, and a first layer 121-2 that are laminated in this order. The upper laminated structure 124 includes a first layer 121-3, a second layer 122-3, a first layer 121-4, and a second layer 122-4 that are laminated in this order.

In regard with the multilayer interference filter 120, the upper laminated structure 124 and the lower laminated structure 125 are configured such that some layers out of a plurality of layers in both the laminated structures are thinner than the other layers, and corresponding layers in both the laminated structures other than the some layers are equal in film thickness to each other. In more detail, the upper laminated structure 124 and the lower laminated structure 125 are configured such that one layer of the first layer 121-3 out of a plurality of first layers 121-1 to 121-4 in both the laminated structures is thinner then the other first layers 121-1, 121-2, and 121-4. That is, the film thickness of the first layer 121-3 is, for example, 25 nm. Furthermore, the upper laminated structure 124 and the lower laminated structure 125 are configured such that the remaining first layers 121-1, 12102, and 121-4 are equal to one another in film thickness (for example, 55 nm) and the second layers 122-1, 122-2, 122-3, and 122-4 are equal to one another in film thickness (for example, 94 nm). In addition, in the multilayer interference filter 120, when the basic configuration is such that the upper laminated structure and the lower laminated structure are symmetric to each other with respect to the interface between the upper laminated structure and the lower laminated structure, the filter has an asymmetric configuration in which one first layer 121-3 is modified to be relatively thin as compared with that of the basic configuration.

Figure 5B:
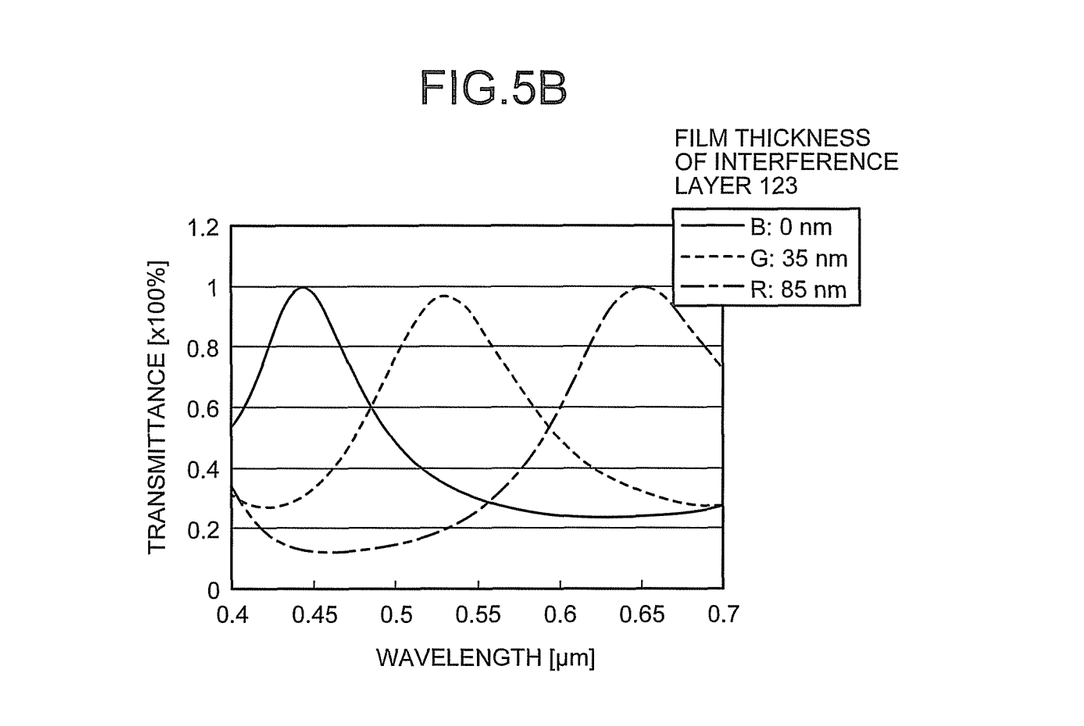

In this configuration, in a case where the thicknesses of the interference layer 123 are set to 0 nm, 35 nm, and 85 nm, respectively, as shown in FIG. 5B, the multilayer interference filter 120 exhibits the spectral transmittance peak of the first order in a blue color (B) wavelength band, a green color (G) wavelength band, and a red color (R) wavelength band, respectively. That is, even with this configuration, in the solid state imaging apparatus 1, the photoelectric conversion layer corresponding to the multilayer interference filter for a color (for example, blue) of a wavelength shorter than the central wavelength can receive a sufficient amount of light that is required to obtain a given sensitivity, so that the sensitivity may improve. That is, it is possible to improve the sensitivity of the photoelectric conversion layer corresponding to the multilayer interference filter for a color (for example, blue) of a wavelength shorter than central wavelength.

Figure 6A:
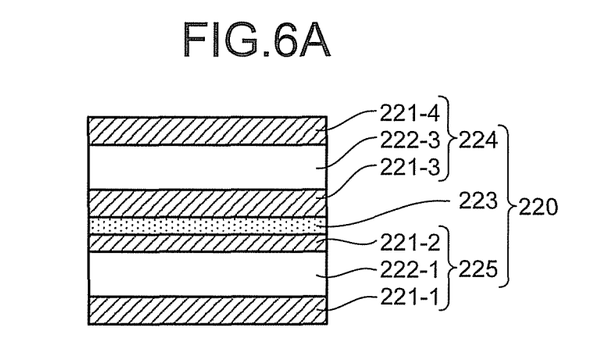
FIGS. 6A and 6B are diagrams illustrating the configuration and properties of a multilayer interference filter according to another modification of the exemplary embodiment.

Alternatively, as shown in FIG. 6A, there may be considered a solid state imaging apparatus including a multilayer interference filter 220 in which a first layer 221-2 as the uppermost layer of a lower laminated structure 225 is thinner not only than the other first layer 221-1 of the lower laminated structure 225, but also than first layers 221-3 and 221-4 of an upper laminated structure 224. In this case, the upper laminated structure 224 and the lower laminated structure 225 are configured such that all the first layers 221-1, 221-3, and 221-4 except for the first layer 221-2 are equal to each other in the film thickness (for example, 55 nm) and second layers 222-1 and 222-3 are equal to each other in film thickness (for example, 94 nm). That is, in regard with the multilayer interference filter 220, when the basic configuration is such that the upper laminated structure and the lower laminated structure are symmetric to each other with respect to the interface between the upper laminated structure and the lower laminated structure, the upper laminated structure and the lower laminated structure are asymmetrically configured such that one first layer 221-2 is modified to be relatively thin as compared with that of the basic configuration.

Figure 6B:
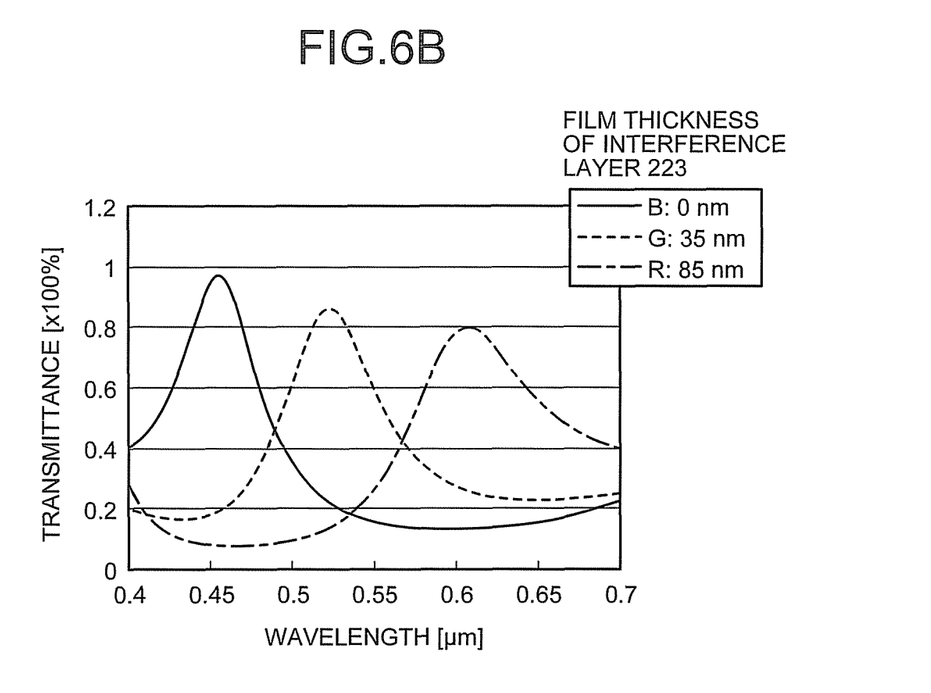

Also with this configuration, in a case where the thicknesses of the interference layers 223 are set to 0 nm, 35 nm, 85 nm, respectively, as shown in FIG. 6B, the multilayer interference filter 220 exhibits the spectral transmittance peak of the first order in a blue color (B) wavelength band, a green color (G) wavelength band, and a red color (R) wavelength band, respectively. That is, in the solid state imaging apparatus with this configuration, the photoelectric conversion layer of the multilayer interference filter for a color of a wavelength shorter than the central wavelength can receive a sufficient amount of light that is required to obtain a given sensitivity and thus the sensitivity improves. That is, it is possible to improve the sensitivity of the photoelectric conversion layer corresponding to the multilayer interference filter for a color (for example, blue) of a wavelength shorter than the central wavelength.

Alternatively, if the multilayer interference filter can exhibit the spectral transmittance peak of the first order in the blue color (B) wavelength band when the thickness of the interference layer is 0 nm, the upper laminated structure and the lower laminated structure of the multilayer interference filter may be configured such that two or more first layers, that constitute a portion of a plurality of first layers in both the laminated structures, are thinner than the other first layers.

For example, the film thickness may be determined to satisfy the condition of "the film thickness of the first layer as the lowermost layer of the upper laminated structure"<"the film thickness of the first layer as the uppermost layer of the lower laminated structure"<"the film thickness of each of the other first layers of the upper laminated structure and the lower laminated structure." Alternatively, for example, the film thickness may be determined to satisfy the condition of "the film thickness of the first layer as the uppermost layer of the lower laminated structure"<"the film thickness of the first layer as the lowermost layer of the upper laminated structure"<"the film thickness of each of the other first layers of both the upper laminated structure and the lower laminated structure."

Alternatively, when the thickness of the interference layer is 0 nm, if the multilayer interference filter can be made to exhibit the spectral transmittance peak of the first order in a blue color (B) wavelength band, some of first layers out of a plurality of first layers in both the upper laminated structure and the lower laminated structure in the multilayer interference filter may be configured to be thinner than the other first layers and some of second layers out of a plurality of second layers in both the upper laminated structure and the lower laminated structure may be configured to be thinner than the other second layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging apparatus comprising:
   a photoelectric conversion layer; and
   a multilayer interference filter disposed so as to selectively guide light of a predetermined color, out of incident light, to the photoelectric conversion layer,
   wherein the multilayer interference filter includes:
   an upper laminated structure in which first layers and second layers are alternately laminated, the first layer and the second layer having different refractive indices; and
   a lower laminated structure in which first layers and second layers are alternately laminated, the first layer and the second layer having different refractive indices;
   wherein the upper laminated structure and the lower laminated structure are equal in number of layers laminated therein,
   wherein each of the lowermost layer of the upper laminated structure and the uppermost layer of the lower laminated structure are configured by the first layer; and
   wherein the upper laminated structure and the lower laminated structure are configured to be asymmetric to each other such that, within some layer sets out of a plurality of layer sets each including two layers disposed at corresponding positions in the upper and lower laminated layers, one layer of the two layers in each layer set of the some layer sets is thinner than the other layer.

2. The solid state imaging apparatus according to claim 1, wherein the refractive index of the first layer is higher than the refractive index of the second layer, and
   wherein the upper laminated structure and the lower laminated structure are configured such that, in one layer set out of a plurality of layer sets each including two first layers disposed at corresponding positions in the upper and lower laminated structures, one first layer of the two first layers in the one layer set is thinner than the other first layer.

3. The solid state imaging apparatus according to claim 2, wherein the one first layer has an optical film thickness smaller than a quarter (¼) of a central wavelength, and the other first layer has an optical film thickness equal to a quarter (¼) of the central wavelength.

4. The solid state imaging apparatus according to claim 2, wherein, within the other layer sets out of the plurality of layer sets, the two first layers are equal in film thickness to each other.

5. The solid state imaging apparatus according to claim 4, wherein, the one first layer has an optical film thickness thinner than a quarter (¼) of a central wavelength, and the other first layer has an optical film thickness equal to a quarter (¼) of the central wavelength, and
   wherein, within the other layer sets, the two first layers have an optical film thickness equal to a quarter (¼) of the central wavelength.

6. The solid state imaging apparatus according to claim 4, wherein the upper laminated structure and the lower laminated structure are configured such that, in one or more layer sets each including two second layers disposed at corresponding positions in the upper and lower laminated structures, the two second layers are equal in film thickness.

7. The solid state imaging apparatus according to claim 6, wherein the one first layer has an optical film thickness thinner than a quarter (¼) of a central wavelength,
   wherein the other first layer has an optical film thickness equal to a quarter (¼) of the central wavelength,
   wherein each of two first layers in the other set has an optical film thickness equal to a quarter (¼) of the central wavelength, and
   each of two second layers in the one or more layer sets has an optical film thickness equal to a quarter (¼) of the central wavelength.

8. The solid state imaging apparatus according to claim 2, wherein the one first layer is the lowermost first layer of the upper laminated structure.

9. The solid state imaging apparatus according to claim 2, wherein the one first layer is the uppermost first layer of the lower laminated structure.

10. The solid state imaging apparatus according to claim 2, wherein, in both the upper laminated structure and the lower laminated structure, two or more first layers as a portion of a plurality of the first layers are respectively thinner than the other first layers.

11. The solid state imaging apparatus according to claim 10,
    wherein the one first layer is the lowermost first layer of the upper laminated structure,
    wherein the other first layer is the uppermost first layer of the lower laminated structure, and
    wherein the upper laminated structure and the lower laminated structure are configured such that the one first layer and the other first layer are thinner than the first layers in the other layer sets out of the plurality of layer sets.

12. The solid state imaging apparatus according to claim 2, wherein the upper laminated structure and the lower laminated structure are configured such that second layers as a portion of a plurality of second layers in both the upper laminated structure and the lower laminated structure are respectively thinner than the other second layers.

13. The solid state imaging apparatus according to claim 1, wherein the multilayer interference filter further comprises an interference layer disposed between the upper laminated structure and the lower laminated structure.

14. The solid state imaging apparatus according to claim 1, comprising:
   a first photoelectric conversion layer;
   a first multilayer interference filter disposed so as to selectively guide light of a first color out of incident light to the first photoelectric conversion layer;
   a second photoelectric conversion layer; and
   a second multilayer interference filter disposed so as to selectively guide light of a second color out of the incident light to the second photoelectric conversion layer;
   wherein the first multilayer interference filter includes an interference layer between an upper laminated structure and a lower laminated structure, and
   wherein the second multilayer interference filter does not include an interference filter between an upper laminated structure and an lower laminated structure.

15. The solid state imaging apparatus according to claim 14,
   wherein each of the upper laminated structure and the lower laminated structure has a central wavelength around the wavelength of the light of the first color.

16. The solid state imaging apparatus according to claim 14,
   wherein each of the upper laminated structure and the lower laminated structure has a central wavelength between the wavelength of the light of the first color and the wavelength of the light of the second color.

17. The solid state imaging apparatus according to claim 1, comprising:
   a first photoelectric conversion layer;
   a first multilayer interference filter disposed so as guide light of a first color out of incident light to the first photoelectric conversion layer;
   a third photoelectric conversion layer; and
   a third multilayer interference filter disposed so as to guide, out of the incident light, light of a third color having a wavelength longer than that of the first color to the third photoelectric conversion layer,
   wherein the first multilayer interference filter includes a first interference layer between an upper laminated structure and a lower laminated structure, and
   wherein the third multilayer interference filter includes a second interference layer thicker than the first interference layer, between an upper laminated structure and a lower laminated structure.

18. The solid state imaging apparatus according to claim 17,
   wherein each of the upper laminated structure and the lower laminated structure has a central wavelength around the wavelength of the light of the first color.

* * * * *